(12) United States Patent
Wang

(10) Patent No.: US 11,635,680 B2
(45) Date of Patent: Apr. 25, 2023

(54) OVERLAY PATTERN

(71) Applicant: CHANGXIN MEMORY TECHNOLOGIES, INC., Hefei (CN)

(72) Inventor: Mei-Li Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/405,093

(22) Filed: Aug. 18, 2021

(65) Prior Publication Data

US 2022/0050375 A1 Feb. 17, 2022

Related U.S. Application Data

(63) Continuation of application No. PCT/CN2021/102339, filed on Jun. 25, 2021.

(30) Foreign Application Priority Data

Aug. 14, 2020 (CN) .......................... 202010818024.3

(51) Int. Cl.
*G03F 7/20* (2006.01)
*G03F 1/50* (2012.01)

(52) U.S. Cl.
CPC .............. *G03F 1/50* (2013.01); *G03F 7/2002* (2013.01); *G03F 7/7015* (2013.01)

(58) Field of Classification Search
CPC ........ G03F 1/50; G03F 7/2002; G03F 7/7015; G03F 7/70633; G03F 7/70683
See application file for complete search history.

(56) References Cited

U.S. PATENT DOCUMENTS

| | | | |
|---|---|---|---|
| 6,399,256 | B1 | 6/2002 | Ueno |
| 6,908,775 | B2 | 6/2005 | Heine |
| 7,512,928 | B2 | 3/2009 | Jessen |
| 7,987,436 | B2 | 7/2011 | Jessen |
| 2006/0183030 | A1 | 8/2006 | Nakao |
| 2007/0035031 | A1 | 2/2007 | Jessen |
| 2009/0146259 | A1 | 6/2009 | Jessen |
| 2020/0201168 | A1 | 6/2020 | Ma et al. |

FOREIGN PATENT DOCUMENTS

| | | |
|---|---|---|
| CN | 1854892 A | 11/2006 |
| CN | 101982880 A | 3/2011 |
| CN | 102207695 A | 10/2011 |
| CN | 102314073 A | 1/2012 |

(Continued)

OTHER PUBLICATIONS

Google translation of CN 104570588, Apr. 2015.*

(Continued)

*Primary Examiner* — Peter B Kim
(74) *Attorney, Agent, or Firm* — Cooper Legal Group, LLC

(57) ABSTRACT

An overlay pattern includes a light-transmitting region and a first light-proof region. The first light-proof region and the light-transmitting region are arranged on a same plane, and an area of the first light-proof region is larger than an area of the light-transmitting region. An orthographic projection of the first light-proof region on the plane and an orthographic projection of the light-transmitting region on the plane do not overlap and form a first rectangular region.

16 Claims, 5 Drawing Sheets

(56) References Cited

FOREIGN PATENT DOCUMENTS

| | | |
|---|---|---|
| CN | 102375351 A | 3/2012 |
| CN | 102436151 A | 5/2012 |
| CN | 102445865 A | 5/2012 |
| CN | 103165417 A | 6/2013 |
| CN | 104570588 A | 4/2015 |
| CN | 105759564 A | 7/2016 |
| CN | 107167937 A | 9/2017 |
| CN | 109901359 A | 6/2019 |
| CN | 209044299 U | 6/2019 |
| CN | 110488578 A | 11/2019 |
| DE | 10122843 A1 | 11/2002 |
| KR | 102207847 B1 * | 1/2021 |

OTHER PUBLICATIONS

First Office Action of the Chinese application No. 202010818024.3, dated Jun. 28, 2022, 7 pgs.
International Search Report in the international application No. PCT/CN2021/102339, dated Sep. 26, 2021, 11 pgs.

* cited by examiner

OVERLAY PATTERN

CROSS-REFERENCE TO RELATED APPLICATIONS

This is a continuation of International Application No. PCT/CN2021/102339, filed on Jun. 25, 2021 and entitled "Overlay Pattern", which claims priority to Chinese Application No. 202010818024.3, filed on Aug. 14, 2020 and entitled "Overlay Pattern". The disclosures of International Application No. PCT/CN2021/102339 and Chinese Application No. 202010818024.3 are hereby incorporated by reference in their entireties.

TECHNICAL FIELD

The present application relates to an overlay pattern.

BACKGROUND

As semiconductor devices have entered nanotechnology process nodes to pursue higher device density, higher performance, and lower cost, multi-layer patterning processes are highly required. For example, the separate arrangement of small patterned devices on different layers may require a precise overlay of the layers, and may also require overlay errors between adjacent layers to reach a preset range. Moreover, the overlay errors may directly affect the product quality of manufactured wafers, and even affect the yield of manufactured semiconductor devices.

SUMMARY

According to embodiments of the disclosure, a first aspect of the disclosure provides an overlay pattern, which includes:

a light-transmitting region; and a first light-proof region, where the first light-proof region and the light-transmitting region is arranged on a same plane, and an area of the first light-proof region is larger than an area of the light-transmitting region.

An orthographic projection of the first light-proof region on the plane and an orthographic projection of the light-transmitting region on the plane do not overlap and form a first rectangular region.

Details of one or more embodiments of the disclosure are set forth in the accompanying drawings and the description below. Other features and advantages of the disclosure will become apparent from the description, the accompanying drawings, and the claims.

BRIEF DESCRIPTION OF THE DRAWINGS

In order to better clarify the technical solution of embodiments of the disclosure or the conventional technology, the accompanying drawings required to illustrate the embodiments or the conventional technology will be simply described blow. It is apparent that the accompanying drawings described below merely illustrate some embodiments of the disclosure. Those of ordinary skill in the art can obtain other accompanying drawings without creative labor on the basis of those accompanying drawings.

Figure 1:
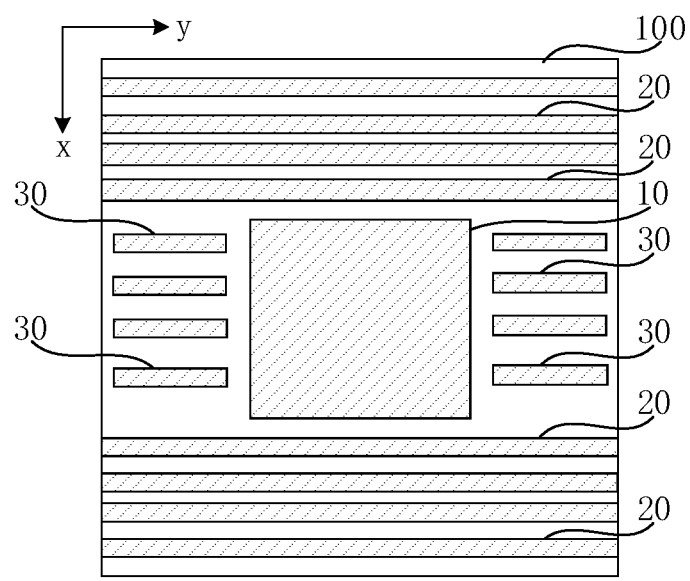
FIG. 1 is a schematic top view of an overlay pattern provided in an embodiment of the present disclosure.

REFERENCE NUMERALS 100, first rectangular region; 10, first sub-rectangular region; 20, second sub-rectangular region; 30, third sub-rectangular region; 40, second light-proof region; 200, second rectangular region; 301, first rectangular light-transmitting region; 302, second rectangular light-transmitting region; 303, third rectangular light-transmitting region; 304, fourth rectangular light-transmitting region; 401, first square light-transmitting region; 50, second square light-transmitting region; 500, rectangular overlay pattern; 501, first sub-rectangular light-proof region; 502, second sub-rectangular light-proof region; 503, third sub-rectangular light-proof region; 504, fourth sub-rectangular light-proof region.

DETAILED DESCRIPTION

In order to facilitate the understanding of the disclosure, the disclosure will be described more comprehensively below with reference to the related drawings. The drawings show preferred embodiments of the disclosure. However, the disclosure may be implemented in various forms and is not limited to the embodiments described herein. On the contrary, these embodiments are provided to make the understanding of the disclosure more thorough and comprehensive.

Unless otherwise defined, all technical and scientific terms used herein have the same meanings as commonly understood by those skilled in the art of the disclosure. Terms used in the description of the disclosure herein are only for the purpose of describing specific embodiments, and not intended to limit the disclosure. Additionally, certain terms used throughout the description and the following claims may refer to particular elements. Those skilled in the art will appreciate that manufacturers may call elements by different names. The present disclosure does not intend to distinguish elements with different names but same functions. In the following description and embodiments, the terms "including" and "comprising" are used in an open type, and thus should be interpreted as "including, but not limited to, . . . ". Likewise, the term "connection" may be intended to mean an indirect or direct electrical connection. Accordingly, if one device is connected to another device, the connection may be a direct electrical connection, or an indirect electrical connection between other devices and connectors.

It should be understood that although the terms "first", "second", etc. may be used herein to describe various elements, these elements should not be limited by these terms. These terms are only used to distinguish one element from another. For example, a first element may be referred to as a second element, and similarly, a second element may be referred to as a first element, without departing from the scope of the present disclosure.

It should be noted that "light-transmitting" in the present disclosure may mean that the transmittance of light is greater than or equal to a preset minimum threshold; and "light-proof" in the present disclosure may mean that the transmittance of light is smaller than or equal to a preset maximum threshold.

In an embodiment of the disclosure, an overlay pattern is provided. The overlay pattern includes a light-transmitting region and a first light-proof region. The first light-proof region and the light-transmitting region are arranged on a same plane. An area of the first light-proof region is larger than an area of the light-transmitting region. An orthographic projection of the first light-proof region on the plane and an orthographic projection of the light-transmitting region on the plane do not overlap and form a first rectangular region.

Specifically, in the overlay pattern from the aforementioned embodiment, the first light-proof region and the light-transmitting region in the overlay pattern may be arranged on the same plane. The orthographic projection of the first light-proof region on the plane and the orthographic projection of the light-transmitting region on the plane do not overlap and form the first rectangular region. And the area of the first light-proof region may be larger than the area of the light-transmitting region. Compared with a conventional overlay pattern, the disclosure has the advantages that the area of the first light-proof region is larger than the area of the light-transmitting region, so that the area of the light-proof region in the overlay pattern can be increased, and the light intensity of light received by a chip can be reduced. Therefore, the situation that the light intensity of exposure for the overlay pattern is high and the image quality of the overlay pattern is affected when adjacent exposure fields are simultaneously exposed can be avoided.

Further, referring to FIG. 1, according to an embodiment of the disclosure, an overlay pattern is provided. The overlay pattern includes a light-transmitting region and a first light-proof region (diagonal line patterning in FIG. 1). The first light-proof region and the light-transmitting region are arranged on a same plane. An area of the first light-proof region is larger than an area of the light-transmitting region. An orthographic projection of the first light-proof region on the plane and an orthographic projection of the light-transmitting region on the plane do not overlap and form a first rectangular region 100. The first light-proof region may include a first sub-rectangular region 10, a plurality of second sub-rectangular regions 20 that are arranged at an interval, and a plurality of third sub-rectangular regions 30 that are arranged at an interval. The first sub-rectangular region 10 may be arranged in a middle of the first rectangular region 100. Each side of the first sub-rectangular region 10 may be perpendicular to two opposite sides of the first rectangular region 100 and parallel to the other two opposite sides of the first rectangular region 100. The plurality of second sub-rectangular regions 20 may be arranged at the interval and distributed on two opposite sides of the first sub-rectangular region 10 along a first direction, such as an x direction shown in FIG. 1. The plurality of third sub-rectangular regions 30 may be arranged at the interval and distributed on the two opposite sides of the first sub-rectangular region 10 along a second direction, such as a y direction shown in FIG. 1. The first direction may be perpendicular to the second direction. An extension direction of the plurality of second sub-rectangular regions 20 may be parallel to an extension direction of the plurality of the third sub-rectangular regions 30.

Specifically, with continued reference to FIG. 1, the first light-proof region may include the first sub-rectangular region 10, arranged in the middle of the first rectangular region 100, and each side of the first sub-rectangular region 10 may be perpendicular to two opposite sides of the first rectangular region 100 and parallel to other two opposite sides of the first rectangular region 100, so as to realize an overlay through the first sub-rectangular region 10. The first light-proof region may further include the plurality of second sub-rectangular regions 20, which may be arranged at an interval and distributed on two opposite sides of the first sub-rectangular region 10 along the first direction. And the first light-proof region may further include the plurality of third sub-rectangular regions 30, which may be arranged at an interval and distributed on the two opposite sides of the first sub-rectangular region 10 along the second direction. The first direction may be perpendicular to the second direction. The extension direction of the plurality of the second sub-rectangular regions 20 may be parallel to the extension direction of the plurality of the third sub-rectangular regions 30. When the area of the light-proof region in the first rectangular region 100 is relatively increased, it is convenient to realize a precise overlay through the first sub-rectangular region 10, the second sub-rectangular regions 20, and the third sub-rectangular regions 30.

As an example, with continued reference to FIG. 1, the plurality of the second sub-rectangular regions 20 may be symmetrically distributed on both sides of a symmetry axis of the first sub-rectangular region 10 that extends along the second direction.

As an example, with continued reference to FIG. 1, the plurality of the third sub-rectangular regions 30 may be symmetrically distributed on both sides of a symmetry axis of the first sub-rectangular region 10 that extends along the first direction.

In the overlay pattern from the aforementioned embodiment, with continued reference to FIG. 1, the second sub-rectangular regions 20 may be symmetrically distributed on both sides of the symmetry axis of the first sub-rectangular region 10 that extends along the second direction, and/or the third sub-rectangular regions 30 may be symmetrically distributed on both sides of the symmetry axis of the first sub-rectangular region 10 that extends along the first direction. Therefore, the overlay precision of the overlay pattern can be conveniently improved while reducing the design complexity of the overlay pattern.

As an example, with continued reference to FIG. 1, according to an embodiment of the disclosure, each of the plurality of the second sub-rectangular regions 20 on a same side of the first sub-rectangular region 10 may have a width of 0.05 to 0.25 μm. For example, each of the plurality of the second sub-rectangular regions 20 on the same side of the first sub-rectangular region 10 may have a width of 0.1 μm or 0.2 μm. A minimum distance between adjacent second sub-rectangular regions 20 on the same side of the first sub-rectangular region 10 may be 0.15 to 0.45 μm. For example, the minimum distance between the adjacent second sub-rectangular regions 20 on the same side of the first sub-rectangular region 10 may be 0.2 μm or 0.4 μm.

As an example, with continued reference to FIG. 1, according to an embodiment of the disclosure, each of the plurality of the third sub-rectangular regions 30 on a same side of the first sub-rectangular region 10 may have a width of 0.05 to 0.25 μm. For example, each of the plurality of the third sub-rectangular regions 30 on the same side of the first sub-rectangular region 10 may have a width of 0.1 μm or 0.2 μm. A minimum distance between adjacent third sub-rectangular regions 30 on the same side of the first sub-rectangular region 10 may be 0.15 to 0.45 μm. For example, the minimum distance between the adjacent third sub-rectangular regions 30 on the same side of the first sub-rectangular region 10 may be 0.2 μm or 0.4 μm.

Figure 2:
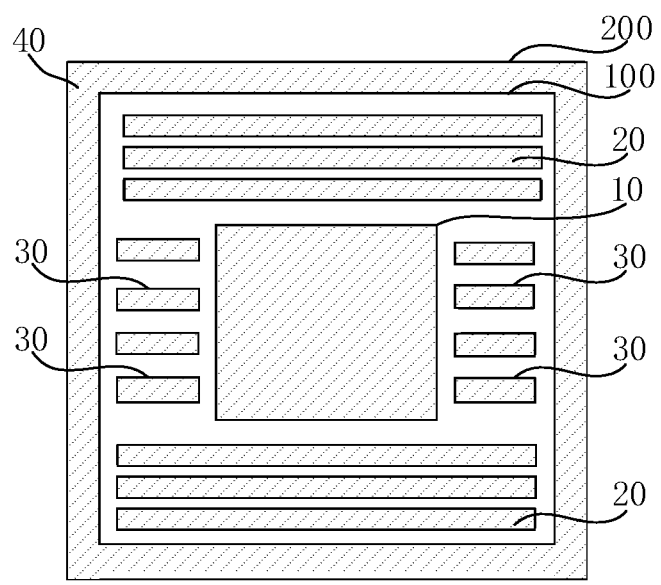
FIG. 2 is a schematic top view of an overlay pattern provided in another embodiment of the present disclosure.

Further, referring to FIG. 2, according to an embodiment of the disclosure, an overlay pattern is provided. The overlay pattern may further include a second light-proof region 40, which may be arranged around the first rectangular region 100. An orthographic projection of the second light-proof region 40 on the plane and an orthographic projection of the first rectangular region 100 on the plane do not overlap and form a second rectangular region 200. Each side of the second rectangular region 200 may be perpendicular to two opposite sides of the first rectangular region 100 and parallel to other two opposite sides of the first rectangular region 100.

Specifically, in the overlay pattern in the aforementioned embodiment, referring to FIG. 2, the second light-proof region 40 may be arranged around an outer side of the first rectangular region 100. The orthographic projection of the second light-proof region 40 on the plane and the orthographic projection of the first rectangular region 100 on the plane do not overlap and form the second rectangular region 200. Each side of the second rectangular region 200 may be perpendicular to two opposite sides of the first rectangular region 100 and parallel to the other two opposite sides of the first rectangular region 100. When the area of the light-proof region in the second rectangular region 200 is relatively increased, it can be convenient to realize a precise overlay through the overlay pattern.

As an example, with continued reference to FIG. 2, according to an embodiment of the disclosure, a distance between each side of the second rectangular region 200 and an adjacent side of the first rectangular region 100 may be 0.15 to 0.25 μm. For example, the distance between each side of the second rectangular region 200 and the adjacent side of the first rectangular region 100 may be 0.2 μm.

Figure 3:
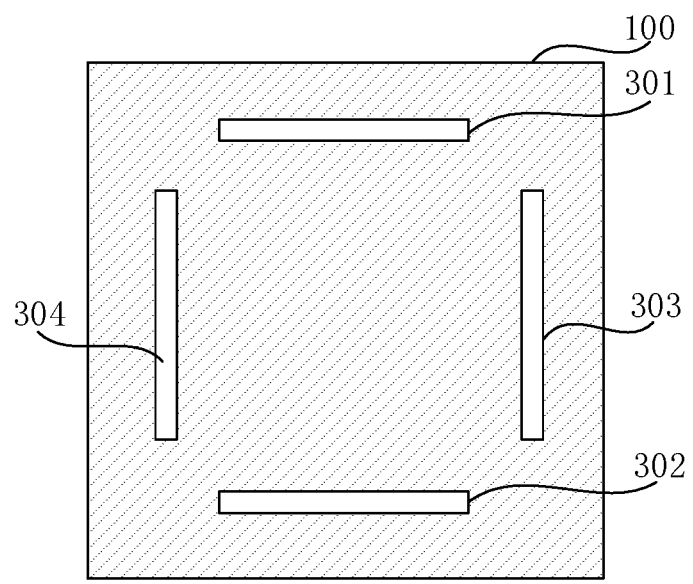
FIG. 3 is a schematic top view of an overlay pattern provided in another embodiment of the present disclosure.

Further, referring to FIG. 3, according to an embodiment of the disclosure, an overlay pattern is provided. The light-transmitting region may include a first rectangular light-transmitting region 301, a second rectangular light-transmitting region 302, a third rectangular light-transmitting region 303, and a fourth rectangular light-transmitting region 304. An extension direction of the first rectangular light-transmitting region 301 may be parallel to an extension direction of the first rectangular region 100. The second rectangular light-transmitting region 302 may be arranged on one side of the first rectangular light-transmitting region 301 and spaced apart from the first rectangular light-transmitting region 301. An extension direction of the second rectangular light-transmitting region 302 may be the same as the extension direction of the first rectangular light-transmitting region 301. The third rectangular light-transmitting region 303 may be arranged between the first rectangular light-transmitting region 301 and the second rectangular light-transmitting region 302. An extension direction of the third rectangular light-transmitting region 303 may be perpendicular to the extension direction of the first rectangular light-transmitting region 301, and a length of the third rectangular light-transmitting region 303 may be smaller than a minimum spacing between the first rectangular light-transmitting region 301 and the second rectangular light-transmitting region 302. The fourth rectangular light-transmitting region 304 may be arranged between the first rectangular light-transmitting region 301 and the second rectangular light-transmitting region 302. An extension direction of the fourth rectangular light-transmitting region 304 may be perpendicular to the extension direction of the first rectangular light-transmitting region 301, and a minimum spacing between the fourth rectangular light-transmitting region 304 and the third rectangular light-transmitting region 303 may be larger than a length of the first rectangular light-transmitting region 301 and a length of the second rectangular light-transmitting region 302.

Specifically, with continued reference to FIG. 3, the light-transmitting region may include the first rectangular light-transmitting region 301, the second rectangular light-transmitting region 302, the third rectangular light-transmitting region 303, and the fourth rectangular light-transmitting region 304. The extension direction of the first rectangular light-transmitting region 301 may be parallel to the extension direction of the first rectangular region 100. The second rectangular light-transmitting region 302 may be arranged on one side of the first rectangular light-transmitting region 301 and spaced apart from the first rectangular light-transmitting region 301. The extension direction of the second rectangular light-transmitting region 302 may be the same as the extension direction of the first rectangular light-transmitting region 301. The third rectangular light-transmitting region 303 may be arranged between the first rectangular light-transmitting region 301 and the second rectangular light-transmitting region 302. The extension direction of the third rectangular light-transmitting region 303 may be perpendicular to the extension direction of the first rectangular light-transmitting region 301, and the length of the third rectangular light-transmitting region 303 may be smaller than the minimum spacing between the first rectangular light-transmitting region 301 and the second rectangular light-transmitting region 302. The fourth rectangular light-transmitting region 304 may be arranged between the first rectangular light-transmitting region 301 and the second rectangular light-transmitting region 302. The extension direction of the fourth rectangular light-transmitting region 304 may be perpendicular to the extension direction of the first rectangular light-transmitting region 301, and the minimum spacing between the fourth rectangular light-transmitting region 304 and the third rectangular light-transmitting region 303 may be larger than the length of the first rectangular light-transmitting region 301 and the length of the second rectangular light-transmitting region 302. In the present embodiment, by setting the light-transmitting region to include an overlay pattern, a precise overlay can be realized through the overlay pattern. Moreover, a region outside the light-transmitting region in the first rectangular region 100 may be set as a light-proof region, so that the area of the light-proof region in the overlay pattern can be relatively increased.

As an example, with continued reference to FIG. 3, according to an embodiment of the disclosure, the first rectangular light-transmitting region 301 may have a length value of 5.5 to 8.5 μm. For example, the first rectangular light-transmitting region 301 may have a length value of 6 μm or 8 μm. The first rectangular light-transmitting region 301 may have a width value of 0.75 to 1.05 μm. For example, the first rectangular light-transmitting region 301 may have a width value of 0.8 μm or 1 μm. The second rectangular light-transmitting region 302 may have a length value of 5.5 to 8.5 μm. For example, the second rectangular light-transmitting region 302 may have a length value of 6 μm or 8 μm. The second rectangular light-transmitting region may have a width value of 0.75 to 1.05 μm. For example, the second rectangular light-transmitting region 302 may have a width value of 0.8 μm or 1 μm. The third rectangular light-transmitting region 303 may have a length value of 5.5 to 8.5 μm. For example, the third rectangular light-transmitting region 303 may have a length value of 6 μm or 8 μm. The third rectangular light-transmitting region 303 may have a width value of 0.75 to 1.05 μm. For example, the third rectangular light-transmitting region 303 may have a width value of 0.8 μm or 1 μm. The fourth rectangular light-transmitting region 304 may have a length value of 5.5 to 8.5 μm. For example, the fourth rectangular light-transmitting region 304 may have a length value of 6 μm or 8 μm. The fourth rectangular light-transmitting region 304 may have a width value of 0.75 to 1.05 μm. For example, the fourth rectangular light-transmitting region 304 may have a width value of 0.8 μm or 1 μm. The first rectangular light-transmitting region, the second rectangular light-transmitting region, the third light-transmitting region, and the fourth rectangular light-transmitting region may have the same or different lengths and widths, and may be freely combined.

Figure 4:
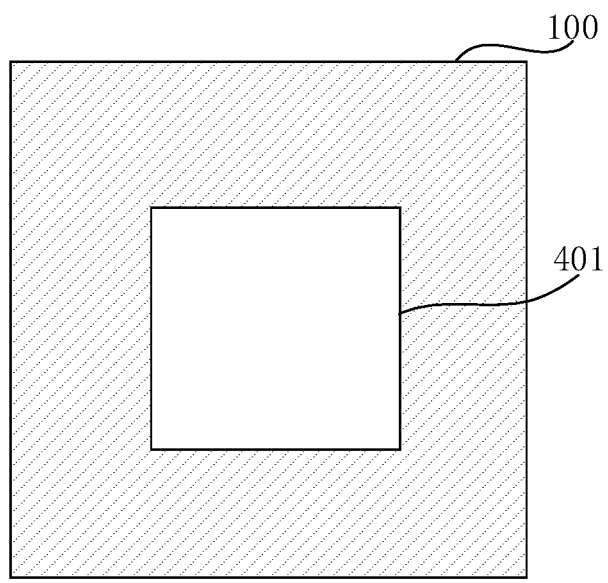
FIG. 4 is a schematic top view of an overlay pattern provided in another embodiment of the present disclosure.

Further, referring to FIG. 4, according to an embodiment of the disclosure, an overlay pattern is provided. The light-transmitting region may include a first square light-transmitting region 401, which may be arranged in a middle of the first rectangular region 100. Each side of the first square light-transmitting region 401 may be perpendicular to two opposite sides of the first rectangular region 100 and parallel to the other two opposite sides of the first rectangular region 100.

Specifically, with continued reference to FIG. 4, the light-transmitting region may include the first square light-transmitting region 401, which may be arranged in the middle of the first rectangular region 100. Each side of the first square light-transmitting region 401 may be perpendicular to two opposite sides of the first rectangular region 100 and parallel to the other two opposite sides of the first rectangular region 100. In the present embodiment, by setting the light-transmitting region to include a square overlay pattern, a precise overlay can be realized through the overlay pattern while reducing the design complexity of the overlay pattern. Moreover, a region outside the light-transmitting region in the first rectangular region may be set as a light-proof region, so that the area of the light-proof region in the overlay pattern can be relatively increased.

As an example, with continued reference to FIG. 4, according to an embodiment of the disclosure, the first square light-transmitting region 401 may have a side length of 9.5 to 16.5 μm. For example, the first square light-transmitting region 401 may have a side length of 10 μm, 12 μm, 14 μm, or 16 μm.

Figure 5:
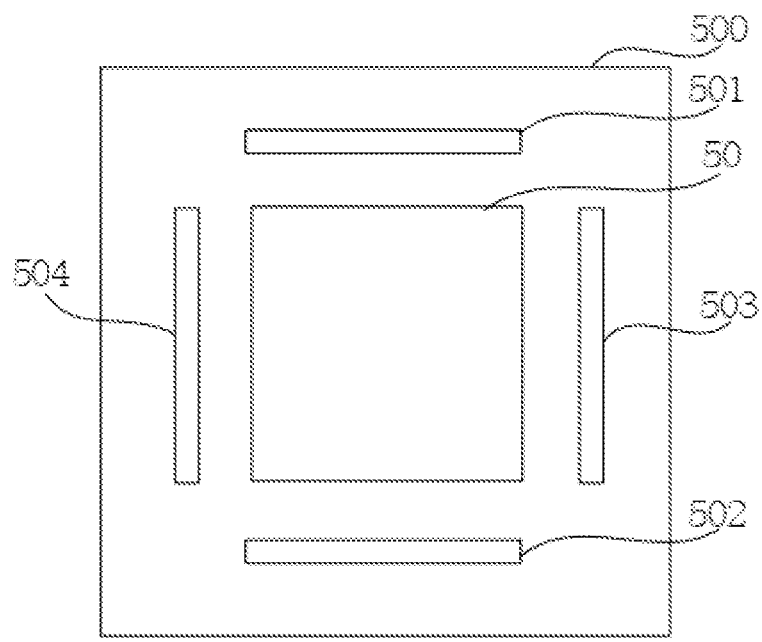
FIG. 5 is a schematic top view of an overlay pattern provided in the prior art.

FIG. 5 shows a rectangular overlay pattern 500 in the prior art. The rectangular overlay pattern 500 may include a second square light-transmitting region 50 in the middle of the rectangular overlay pattern 500, a first sub-rectangular light-proof region 501, a second sub-rectangular light-proof region 502, a third sub-rectangular light-proof region 503, and a fourth sub-rectangular light-proof region 504. The first sub-rectangular light-proof region 501, the second sub-rectangular light-proof region 502, the third sub-rectangular light-proof region 503, and the fourth sub-rectangular light-proof region 504 are circumferentially distributed around the second square light-transmitting region 50 at an interval, and spaced apart from the second square light-transmitting region 50 respectively. An extension direction of the first sub-rectangular light-proof region 501 is parallel to an extension direction of the second sub-rectangular light-proof region 502. The first sub-rectangular light-proof region 501 and the second sub-rectangular light-proof region 502 are distributed on two opposite sides of the second square light-transmitting region 50. The third sub-rectangular light-proof region 503 and the fourth sub-rectangular light-proof region 504 are distributed on the other two opposite sides of the second square light-transmitting region 50. An extension direction of the third sub-rectangular light-proof region 503 is parallel to an extension direction of the fourth sub-rectangular light-proof region 504, and the extension direction of the third sub-rectangular light-proof region 503 is perpendicular to the extension direction of the first sub-rectangular light-proof region 501. Both of the third sub-rectangular light-proof region 503 and the fourth sub-rectangular light-proof region 504 are arranged between the first sub-rectangular light-proof region 501 and the second sub-rectangular light-proof region 502. A length of the third sub-rectangular light-proof region 503 is smaller than a minimum spacing between the first sub-rectangular light-proof region 501 and the second sub-rectangular light-proof region 502. Additionally, a length of the fourth sub-rectangular light-proof region 504 is smaller than the minimum spacing between the first sub-rectangular light-proof region 501 and the second sub-rectangular light-proof region 502. Both of the first sub-rectangular light-proof region 501 and the second sub-rectangular light-proof region 502 are arranged between the third sub-rectangular light-proof region 503 and the fourth sub-rectangular light-proof region 504. A minimum spacing between the third sub-rectangular light-proof region 503 and the fourth sub-rectangular light-proof region 504 is larger than the length of the first sub-rectangular light-proof region 501 and the length of the second sub-rectangular light-proof region 502. Each side of the second square light-transmitting region 50 is parallel to two opposite sides of the rectangular overlay pattern 500, and perpendicular to the other two opposite sides of the rectangular overlay pattern 500. The extension direction of the first sub-rectangular light-proof region 501 is parallel to two opposite sides of the second square light-transmitting region 50. The extension direction of the third sub-rectangular light-proof region 503 is parallel to the other two opposite sides of the second square light-transmitting region 50. By comparing the areas of the light-proof regions in FIGS. 1, 2, 3, and 4 with the area of the light-proof region in FIG. 5 respectively, it can be seen that the areas of the light-proof regions in the overlay pattern are relatively increased in FIGS. 1, 2, 3, and 4, so that the light intensity of light received by a chip may be reduced. Therefore, the situation that the light intensity of exposure for the overlay pattern is high and the image quality of the overlay pattern is affected when adjacent exposure fields are simultaneously exposed can be effectively avoided.

Specifically, for example, when the photoresist thickness of a deep n-well (DNW) layer is high, exposure energy required for the DNW layer may be relatively high, so that exposure intensities between adjacent exposure fields will affect each other, resulting in a high light intensity of exposure for the overlay pattern. However, in the disclosure, the area of the light-proof region in the overlay pattern is relatively increased, so that the light intensity of light received by a chip can be reduced. Therefore, the situation that the light intensity of exposure for the overlay pattern is high and the image quality of the overlay pattern is affected when adjacent exposure fields are simultaneously exposed can be effectively avoided.

It should be noted that the aforementioned embodiments are for illustrative purposes only and are not meant to limit the present disclosure.

Various embodiments in the present description are all described a progressive manner Each of the embodiments focuses on the differences from other embodiments, and the same or similar parts of the embodiments can be referred to each other.

Various technical features in the aforementioned embodiments may be randomly combined. In order to make the description concise, not all possible combinations of the technical features in the aforementioned embodiments are described. However, as long as there is no contradiction in the combinations of the technical features, the combinations of the technical features should be regarded as falling within the scope of the present description.

The aforementioned embodiments merely represent several implementations of the disclosure, and the descriptions are relatively specific and detailed, but should not be construed as a limitation to the scope of the disclosure. It should be noted that those of ordinary skill in the art may further make variations and improvements without departing from the conception of the disclosure, and these all fall within the protection scope of the disclosure. Therefore, the protection scope of the disclosure should be subject to the appended claims.

The invention claimed is:

1. An overlay pattern, comprising:
   a light-transmitting region; and
   a first light-proof region, wherein the first light-proof region and the light-transmitting region are arranged on a same plane, and an area of the first light-proof region is larger than an area of the light-transmitting region,
   wherein an orthographic projection of the first light-proof region on the plane and an orthographic projection of the light-transmitting region on the plane do not overlap and form a first rectangular region;
   wherein the first light-proof region comprises:
      a first sub-rectangular region, arranged in a middle of the first rectangular region, wherein each side of the first sub-rectangular region is perpendicular to two opposite sides of the first rectangular region and parallel to other two opposite sides of the first rectangular region;
      a plurality of second sub-rectangular regions, arranged at an interval and distributed on two opposite sides of the first sub-rectangular region along a first direction; and
      a plurality of third sub-rectangular regions, arranged at an interval and distributed on the two opposite sides of the first sub-rectangular region along a second direction, wherein the first direction is perpendicular to the second direction,
      wherein an extension direction of the plurality of the second sub-rectangular regions is parallel to an extension direction of the plurality of the third sub-rectangular regions.

2. The overlay pattern of claim 1, wherein the plurality of the second sub-rectangular regions are symmetrically distributed on both sides of a symmetry axis of the first sub-rectangular region that extends along the second direction.

3. The overlay pattern of claim 1, wherein the plurality of the third sub-rectangular regions are symmetrically distributed on both sides of a symmetry axis of the first sub-rectangular region that extends along the first direction.

4. The overlay pattern of claim 1, wherein
   each of the plurality of the second sub-rectangular regions on a same side of the first sub-rectangular region has a width of 0.05 to 0.25 µm, and a minimum distance between adjacent second sub-rectangular regions on the same side of the first sub-rectangular region is 0.15 to 0.45 µm.

5. The overlay pattern of claim 1, wherein
   each of the plurality of the third sub-rectangular regions on a same side of the first sub-rectangular region has a width of 0.05 to 0.25 µm, and a minimum distance between adjacent third sub-rectangular regions on the same side of the first sub-rectangular region is 0.15 to 0.45 µm.

6. The overlay pattern of claim 4, wherein each of the plurality of the second sub-rectangular regions on the same side of the first sub-rectangular region has a width of 0.1 µm or 0.2 µm.

7. The overlay pattern of claim 4, wherein the minimum distance between the adjacent second sub-rectangular regions on the same side of the first sub-rectangular region is 0.2 µm or 0.4 µm.

8. The overlay pattern of claim 5, wherein each of the plurality of the third sub-rectangular regions on the same side of the first sub-rectangular region has a width of 0.1 µm or 0.2 µm.

9. The overlay pattern of claim 5, wherein the minimum distance between the adjacent third sub-rectangular regions on the same side of the first sub-rectangular region is 0.2 µm or 0.4 µm.

10. The overlay pattern of claim 1, further comprising:
    a second light-proof region, arranged around the first rectangular region, wherein an orthographic projection of the second light-proof region on the plane and an orthographic projection of the first rectangular region on the plane do not overlap and form a second rectangular region,
    wherein each side of the second rectangular region is perpendicular to two opposite sides of the first rectangular region and parallel to other two opposite sides of the first rectangular region.

11. The overlay pattern of claim 10, wherein a distance between each side of the second rectangular region and an adjacent side of the first rectangular region is 0.15 to 0.25 µm.

12. The overlay pattern of claim 11, wherein the distance between each side of the second rectangular region and the adjacent side of the first rectangular region is 0.2 µm.

13. The overlay pattern of claim 1, wherein the light-transmitting region comprises:
    a first rectangular light-transmitting region, wherein an extension direction of the first rectangular light-transmitting region is parallel to an extension direction of the first rectangular region;
    a second rectangular light-transmitting region, arranged on one side of the first rectangular light-transmitting region and spaced apart from the first rectangular light-transmitting region, wherein an extension direction of the second rectangular light-transmitting region is the same as the extension direction of the first rectangular light-transmitting region;
    a third rectangular light-transmitting region, arranged between the first rectangular light-transmitting region and the second rectangular light-transmitting region, wherein an extension direction of the third rectangular light-transmitting region is perpendicular to the extension direction of the first rectangular light-transmitting region, and a length of the third rectangular light-transmitting region is smaller than a minimum spacing between the first rectangular light-transmitting region and the second rectangular light-transmitting region; and
    a fourth rectangular light-transmitting region, arranged between the first rectangular light-transmitting region and the second rectangular light-transmitting region, wherein an extension direction of the fourth rectangular light-transmitting region is perpendicular to the extension direction of the first rectangular light-transmitting region, and a minimum spacing between the fourth rectangular light-transmitting region and the third rectangular light-transmitting region is larger than a length of the first rectangular light-transmitting region and a length of the second rectangular light-transmitting region.

14. The overlay pattern of claim 13, wherein the first rectangular light-transmitting region has a length value of 5.5 to 8.5 μm and a width value of 0.75 to 1.05 μm;

the second rectangular light-transmitting region has a length value of 5.5 to 8.5 μm and a width value of 0.75 to 1.05 μm;

the third rectangular light-transmitting region has a length value of 5.5 to 8.5 μm and a width value of 0.75 to 1.05 μm; and the fourth rectangular light-transmitting region has a length value of 5.5 to 8.5 μm and a width value of 0.75 to 1.05 μm.

15. The overlay pattern of claim 1, wherein the light-transmitting region comprises:

a first square light-transmitting region, arranged in the middle of the first rectangular region, wherein each side of the first square light-transmitting region is perpendicular to two opposite sides of the first rectangular region and parallel to other two opposite sides of the first rectangular region.

16. The overlay pattern of claim 15, wherein the first square light-transmitting region has a side length of 9.5 to 16.5 μm.

* * * * *